US008053080B2

(12) United States Patent
Fukui et al.

(10) Patent No.: US 8,053,080 B2
(45) Date of Patent: Nov. 8, 2011

(54) MODIFICATION PROCESS OF SYNTHETIC SILICA POWDER AND ITS QUARTZ GLASS PRODUCT

(75) Inventors: Masanori Fukui, Akita (JP); Takahiro Satoh, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 0 days.

(21) Appl. No.: 12/768,904

(22) Filed: Apr. 28, 2010

(65) Prior Publication Data

US 2010/0212582 A1    Aug. 26, 2010

Related U.S. Application Data

(62) Division of application No. 10/303,899, filed on Nov. 26, 2002, now Pat. No. 7,736,613.

(30) Foreign Application Priority Data

Nov. 26, 2001 (JP) ................. 2001-358746

(51) Int. Cl.
*B32B 13/04* (2006.01)
*B32B 17/06* (2006.01)
*A47G 19/22* (2006.01)

(52) U.S. Cl. ..... 428/428; 428/34.1; 428/34.4; 428/34.6; 428/426; 428/446

(58) Field of Classification Search ............. 428/34.1, 428/34.4, 426, 428, 446
See application file for complete search history.

(56) References Cited

U.S. PATENT DOCUMENTS

| 4,072,489 A | 2/1978 | Loxley et al. |
| 4,317,668 A | 3/1982 | Susa et al. |
| 4,956,208 A * | 9/1990 | Uchikawa et al. ........... 428/34.6 |
| 4,979,973 A | 12/1990 | Takita et al. |
| 5,185,020 A | 2/1993 | Satoh et al. |
| 6,849,242 B1 | 2/2005 | Koeppler et al. |
| 2002/0115757 A1 | 8/2002 | Murschall et al. |
| 2002/0166341 A1 * | 11/2002 | Shelley et al. ................. 65/17.3 |
| 2003/0125187 A1 | 7/2003 | Akimoto et al. |

FOREIGN PATENT DOCUMENTS

| DE | 195 41 372 A1 | 5/1996 |
| EP | 0 530 825 A1 | 3/1993 |
| EP | 1 167 309 A1 | 1/2002 |
| JP | 1-148782 | 6/1989 |
| JP | 03-086249 | 4/1991 |
| JP | 07-172978 | 7/1995 |
| JP | 09-086916 | 3/1997 |
| JP | 10-287416 | 10/1998 |
| JP | 11-049597 | 2/1999 |
| JP | 2001-261353 | 9/2001 |

OTHER PUBLICATIONS

Webster's II, New Riverside University Dictionary, 1984 (no month), p. 376.

* cited by examiner

*Primary Examiner* — Gwendolyn Blackwell
(74) *Attorney, Agent, or Firm* — Oblon, Spivak, McClelland, Maier & Neustadt, L.L.P.

(57) ABSTRACT

A modification process of the synthetic quartz powder, which can make a quartz glass product hardly having bubbles at the time of fusing, is provided, along with a modification process of the synthetic quartz powder and a glass product using said modified quartz powder are provided, wherein the synthetic quartz powder is kept in helium atmosphere at least in the temperature falling process, when the amorphous synthetic quartz powder produced by the sol-gel method is carried out by heat treatment in a vacuum furnace at more than the degas temperature and less than the baking temperature, wherein the highest temperature in the helium atmosphere is preferably set to from more than 700° C. to less than 1400° C., and the helium atmosphere is kept to less than 400° C.

6 Claims, No Drawings

MODIFICATION PROCESS OF SYNTHETIC SILICA POWDER AND ITS QUARTZ GLASS PRODUCT

STATEMENT REGARDING RELATED APPLICATIONS

The present application is a Divisional of co-pending U.S. application Ser. No. 10/303,899, filed Nov. 26, 2002, the entire contents of which are hereby incorporated by reference.

BACKGROUND OF THE INVENTION

1. Field of the Invention

The present invention relates to a modification process of a synthetic quartz powder, wherein it is possible to make a quartz glass having few carbon content and hydroxyl group content and hardly having an inner bubble content at the time of fusing to be vitrified at high temperature, and also relates to a glass product using said quartz powder.

2. Discussion of the Background

It has been known that a process, in which a gel made by hydrolyzing a metal alkoxide etc. is dried and baked to produce the synthetic quartz powder, i.e., a sol-gel method. Conventionally, it has been known that the synthetic quartz powder made by said producing process is amorphous and has high purity having fewer metal impurities than the natural quartz powder. However, it has been also known that there are a residual carbon or a residual hydroxyl group from an alkoxy group in said synthetic quartz powder. Therefore, when the quartz glass crucible is produced by using the synthetic quartz powder made by the sol-gel method as a raw material, said residual carbon etc. becomes the cause of the inner bubbles.

Then, regarding the synthetic quarts powder produced by the sol-gel method, many trials for reducing the residual carbon have been carried out. For example, the following processes etc. have been already known. The process, in which the dried gel powder is heated to remove the residual carbon by burning at the temperature of less than 600° C., in which the pores in the powder are not closed, and after this decarbonization, said heated powder is baked to be vitrified at the high temperature being about from 1000° C. to 1300° C., in which the pores are closed, to produce the amorphous synthetic quartz powder, i.e., shown in Japanese Patent Laid Open No. H09-86916 or No. H10-287416, etc. The process, in which the silica powder produced by the sol-gel method is heated at about 500° C. in air to burn organic components, and is vitrified by heating to fuse at more high temperature to remove the OH group. The process, in which the dried gel powder is baked in two steps at a dried atmosphere or a reduced atmosphere at the time of making the synthetic quartz powder to bake the dried gel powder, and then, the synthetic quartz powder having the predetermined high density is produced i.e., shown in Japanese Patent Registration No. 2530225. However, it is impossible to reduce sharply the residual carbon in the quartz powder by these conventional producing processes, so that it is substantially difficult to produce the glass products hardly having inner bubbles.

On the other hand, it has been known that the process, in which the quartz powder produced by the sol-gel method is carried out by the heat treatment at the temperature being from 800° C. to 1300° C. in hydrogen atmosphere, to make the quartz powder which does not indicate a spectral peak of $O=C=O$ bonding, and the quartz crucible is produced by using said quartz powder as the raw material, i.e., shown in Japanese Patent Laid Open No. 2001-261353. However, in this process, there is a problem that the concentration of OH basis and the amount of an adsorbed water in the quartz powder become high by the hydrogen gas, so that the inner bubbles are increased by the adsorbed water etc., when the quartz powder is vitrified. Moreover, it is dangerous that the hydrogen gas is introduced at the high temperature. Furthermore, it has been also known that the process other than these processes, in which after a fumed-silica produced by the sol-gel method is carried out the heat treatment, said fumed-silica is baked in vacuum, hydrogen, or helium atmosphere at high temperature to make the quartz glass powder, i.e., shown in Japanese Patent Laid Open No. 2001-89168.

Although all of the above-mentioned conventional modification processes are aimed at the removing of the residual carbon, the cause of the bubble aroused at the time of vitrifying the quartz powder is not limited to the residual carbon. The air components adsorbed to the quartz powder after the heat treatment also become the important cause of the inner bubble. Regarding the present invention, it is possible to make the quartz glass crucible which has no bubbles substantially by carrying out the heat treatment and also preventing the adsorption of the air components after said heat treatment. In addition, the above-mentioned problems in the conventional modification processes for producing the quartz powder are also solved.

SUMMARY OF THE INVENTION

The present invention provides the modification process, in which the synthetic quartz powder is carried out the vacuum treatment at high temperature and treated in the helium atmosphere, to prevent the adsorption of the air components with removing the gas components contained in the quartz powder, so that it is possible to make the quartz glass hardly having the bubbles at the time of fusing.

That is, the present invention relates to the following modification process of the synthetic quartz powder.

[1] A modification process of a synthetic quartz powder, said process comprising,
keeping an amorphous synthetic quartz powder made by sol-gel method in helium atmosphere at least in a temperature falling process, when a heat treatment is carried out in a vacuum furnace at more than a degas temperature and less than a sintering temperature.

The modification process of the present invention also includes the following modification processes.

[2] A modification process,
wherein the highest temperature in the helium atmosphere is from more than 700° C. to less than 1400° C., and the helium atmosphere is kept until less than 400° C.

[3] A modification process, said process comprising,
introducing helium gas having a dew point of less than −50° C. to the inside of the furnace, and
cooling the inside of the furnace with keeping the helium atmosphere.

[4] A modification process, said process also comprising,
evacuating the inside of the furnace to the reached vacuum of less than 5 Pa, and
introducing the helium gas at least in the temperature falling process, when the heat treatment is carried out at the temperature being in the above-mentioned range.

[5] A modification process, said process also comprising,
heating the inside of the vacuum furnace where a synthetic quartz powder is put in, at the temperature being from 700° C. to 1400° C., preferably from 800° C. to 1200° C.,
keeping the temperature being in the above-mentioned range until the vacuum degree in the furnace being less than 5 Pa, introducing the helium gas having a dew point of less than −50° C. to the inside of the furnace, cooling to less than 400° C. with keeping the helium atmosphere, and opening the inside of the furnace to air.

Furthermore, the present invention relates to the following quartz glass product and the quartz glass crucible.

[6] A quartz glass product produced by using the synthetic quartz powder,
wherein said synthetic quartz powder is treated by any one of the processes from above [1] to [5].

[7] A quartz glass crucible for pulling up silicon single crystal, wherein at least a part of an inside surface of the crucible is treated with the synthetic quartz powder made by any one of the processes from above [1] to [5] as a raw material,
a bubble content ratio at a bottom part of a transparent glass layer having a layer thickness of less than 0.5 mm from the inside surface of the crucible is less than 0.1% before use and less than 5% after use, and
a bubble content ratio at a side wall part of said transparent glass layer is less than 3% before use and less than 10% after use.

DETAILED DESCRIPTION OF THE PREFERRED EMBODIMENT

Regarding the modification process of the present invention, the synthetic quartz powder is heated and kept in high vacuum, for example, the vacuum degree is less than 5 Pa, and at more than the degas temperature and less than the sintering temperature, to remove remarkably the residual gas components in the powder. Moreover, the helium gas diffuses to the inner pore and the inside surface of the quartz powder to drive out the residual gas component by keeping said quartz powder in the helium atmosphere before taking out to air. Since said helium gas diffuses in the quartz glass to disappear the bubbles when the quartz powder is heated to produce the glass product, it is possible to make the quartz glass hardly having the bubbles.

Hereafter, the present invention is explained concretely according to the preferred embodiment.

The modification process of the present invention is the modification process of the quartz glass crucible, in which the amorphous synthetic quartz powder made by the sol-gel method is kept in the helium atmosphere at least in the temperature falling process, when the heat treatment is carried out in the vacuum furnace at more than the degas temperature and less than the sintering temperature.

In the present invention, the synthetic quartz powder produced by the sol-gel method is the silica gel powder produced by the sol-gel method being the hydrolysis of alkoxysilane, etc., and the synthetic quartz powder made by using said silica gel powder. The gel made by the hydrolysis of alkoxysilane etc. is pulverized and dried to make the dried silica gel powder. In addition, when said dried silica gel powder is dehydrated by baking at the predetermined temperature, the amorphous synthetic quartz powder can be made.

When the synthetic quartz powder produced by the sol-gel method is carried out the heat treatment in the vacuum furnace at more than the degas temperature and less than the baking temperature, the helium gas is introduced to the inside of the furnace at least in the temperature falling process to keep the helium atmosphere. The heating temperature is more than the degas temperature and less than the sintering temperature. The degas temperature is about more than 700° C., at which the gas components adsorbed to the synthetic quartz powder are moved away. The powder sintering temperature is about more than 1400° C., at which the synthetic quartz powder is sintered. Therefore, it is preferable that the heating temperature is from more than 700° C. to less than 1400° C., more preferably from 800° C. to 1200° C. Moreover, it is preferable that the time keeping the synthetic quartz powder at said temperature range is more than 1 hour, preferably from 2 to 24 hours. If said time is less than 1 hour, the degas treatment is insufficient.

It is preferable that the above-mentioned heat treatment is carried out in vacuum. When the quartz powder is kept in vacuum and at the above-mentioned temperature range, it is possible to remove most of the gas components adsorbed or intermixed to the quartz powder. Specifically, for example, when the quartz powder is kept at the above-mentioned high temperature until the reached vacuum degree being less than 5 Pa, it is possible to reduce the residual carbon to less than 2 ppm and the residual hydroxyl group to less than 50 ppm.

After said heat treatment, the inside of the furnace is kept in the helium atmosphere to be cooled. If the quartz powder carried out the degas treatment is exposed into air directly, the gas components in air are adsorbed again to the quartz powder, and when said quartz powder is fused to be vitrified, said adsorbed gas components become the cause of the inner bubble. Regarding the modification process of the present invention, the quartz powder carried out the degas treatment is kept in the helium atmosphere to adsorb the helium gas to the quartz powder before taking out to air. Then, when said quartz powder is exposed into air after said process, the gas components in air is hardly adsorbed. Moreover, when the quartz powder is heated and fused to be vitrified, the adsorbed helium does not remain in the glass as the bubble, because of said helium can diffuse easily in the glass. By the way, said effect is not obtained with argon or nitrogen other than helium.

It is preferable that the temperature making the inside of the furnace into the helium atmosphere is from 700° C. to 1400° C., and is also preferable that the helium atmosphere is kept to less than 400° C. while the temperature falling process. If the helium atmosphere is opened to air at the temperature being less than 700° C. or more than 400° C., there are few adsorption amount of helium to the quartz powder. In such condition, when the quartz powder is taken out to air, the gas components in air are adsorbed, so that it is difficult to obtain the sufficient effect to reduce the bubbles at the time of vitrifying the quartz powder. In order to adsorb helium fully to the quartz powder to control the adsorption of the air components, it is preferable that the helium gas is introduced to the inside of the furnace at the temperature being more than 700° C. at least at the time of the temperature falling, that is, while or after the heat treatment, and said helium gas is kept until the temperature inside the furnace being less than 400° C., and after that, the inside of the furnace is opened to air to take out the quartz powder. When the inside of the furnace is kept in the helium atmosphere to less than 400° C., helium is adsorbed fully to the quartz powder, so that it is possible to prevent the adsorption of the air components.

It is preferable that the temperature of the introduced helium gas has the dew point of less than −50° C. If the temperature of the introduced helium gas has the dew point of more than −50° C., a few water existing in the helium gas is adsorbed to the quartz powder, and this water becomes the cause of the inner bubbles when the quartz powder is vitrified.

As mentioned above, regarding the modification process of the present invention, for example, the temperature inside the vacuum furnace, in which the synthetic quartz powder is put in, is set to from 700° C. to 1400° C., preferably from 800° C. to 1200° C., and the inside of the furnace is kept in the helium atmosphere at least at the time of the temperature falling, wherein it is preferable that the temperature inside of the furnace is more than 700° C. In addition, when the inside of the furnace is carried out the heat treatment in vacuum having the vacuum degree of less than 5 Pa, it is preferable that the inside of the furnace is evacuated until the vacuum degree becomes less than 5 Pa to be kept at the above-mentioned temperature range. After that, the helium gas having the dew point of less than −50° C. is introduced to the inside of the furnace at the temperature being more than 700° C., and is kept until the temperature of the inside of the furnace becomes to less than 400° C. by cooling. Then, the quartz powder is taken out to air. By the way, when the helium gas is not introduced after the heat treatment at vacuum, it is necessary that the quartz powder is taken out after cooling the inside of the furnace to less than 200° C.

As mentioned above, regarding the synthetic quartz powder, the degas treatment is carried out by the heat treatment at the high temperature, and the helium atmosphere is kept to adsorb helium to the quartz powder to control the adsorption of the air components. Therefore, it is possible to make the quartz glass hardly having the bubbles when the quartz powder is taken out to air to be fused and vitrified. Specifically, it is possible to make the quartz glass crucible for pulling up silicon single crystal, in which the bubble content ratio at the bottom part is less than 0.1% before use and less than 5% after use, and the bubble content ratio at the side wall part is less than 3% before use and less than 10% after use.

EXAMPLE

The present invention is explained concretely with Example.

Example and Comparison Example

The amorphous synthetic quartz powder made by hydrolyzing alkoxysilane, in which the concentration of the residual carbon was 27.4 ppm and the residual hydroxyl group was 76 ppm, was heated to be degassed in vacuum under the condition shown in Table 1. After that, said degassed powder was cooled in the helium gas atmosphere. The concentrations of the residual carbon and the residual hydroxyl group after the heat treatment in vacuum and the cooling treatment, were shown in Table 1. Moreover, said treated synthetic quartz powder was used as a part of the material to produce the quartz glass crucible. Regarding said crucible, the synthetic quartz powder shown in Table 1 was used to the inside part of the crucible, in which the inside surface layer having the layer thickness of 2 to 3 mm from the inside surface was made by the synthetic quartz, and the outside surface layer was made by the natural quartz layer having the layer thickness of 10 to 12 mm. The bubble content ratio of the inside surface layer of said quartz glass crucible, in which the layer thickness was 0.5 mm, was measured. In addition, the pulling up of silicon single crystal was carried out by using said crucibles. These results were shown in Table 1 collectively.

As shown in Table 1, regarding the quartz glass crucibles produced by the synthetic quartz powder carried out the modification process of the present invention as the raw material (Example: No. A1 to A4), the bubble content ratios were remarkably low, and the sufficient rates of single crystallization were realized. By the way, regarding Examples carried out the treatment in the helium atmosphere of the present invention (No. A1 to A4), all of the bubble content ratios at the bottom part of the quartz crucible were less than 0.1% before use and less than 5% after use. Moreover, all of the bubble content ratios at the side wall part were less than 0.3% before use and less than 10% after use. On the other hand, regarding the quartz glass crucibles produced by the quartz powders of Comparison examples, which were not treated in the condition of the present invention (No. B1 to B6), the bubble content ratios became partially about from 10 to 50 times of the bubble content ratios of the present invention, and the rates of single crystallization were less than a half of the present invention. By the way, regarding Comparison example B1, since the temperature of the inside of the furnace was too high, the quartz powder, which was the raw material, was sintered. Regarding Comparison example B2, since the temperature of the inside of the furnace at the time of opening to air after the helium treatment was more than 400° C., the bubble content ratio of the quartz crucible was high. Regarding Comparison example B3, the dew point of helium was high. Moreover, regarding Comparison example B4, since the highest temperature inside of the furnace was 600° C., helium was hardly adsorbed to the quartz powder at the time of introducing, so that the state of the quartz powder did not change with after the heating in vacuum. Therefore, even when the temperature at the time of opening to air was 400° C., the gas component s of air were adsorbed to the quartz powder. As a result, the bubble content ratio of the quartz crucible was high. Regarding Comparison example B5 using nitrogen instead of helium, the bubble content ratio of the quartz crucible was almost same value of Comparison example 6 made by non treated quartz powder, and there were no reducing bubble effect.

Effect of the Invention

Regarding the modification process of the present invention, since the synthetic quartz powder is kept in the helium atmosphere after the heat treatment to prevent the adsorption of the air components, it is possible to make the quarts glass product hardly having the bubbles even when said quartz powder is vitrified by fusing.

TABLE 1

| | Example 1 | | | | Comparison example 1 | | | | | |
|---|---|---|---|---|---|---|---|---|---|---|
| | A1 | A2 | A3 | A4 | B1 | B2 | B3 | B4 | B5 | B6 |
| [Heating Modification process at Vacuum] | | | | | | | | | | No-treatment |
| Heating Temperature (° C.) | 1300 | 1200 | 800 | 1300 | 1450 | 1200 | 1200 | 1200 | 1200 | |
| Heating Time (hr) | 24 | 24 | 24 | 2 | 8 | 24 | 24 | 24 | 24 | |
| Reached Vacuum Degree (Pa) | 0.8 | 1.1 | 3.3 | 4.7 | 24.3 | 1.1 | 1 | 1 | 1 | |
| [Helium Atmosphere] | | | | | | | | | Nitrogen | |
| Highest Temperature ° C. | 1300 | 1200 | 700 | 1300 | 1450 | 1200 | 1200 | 600 | 1200 | |
| Temperature of Dew point of He ° C. | −80 | −80 | −50 | −50 | −80 | −80 | −40 | −80 | −80 | |
| Material Opening Temperature ° C. | 400 | 400 | 400 | 400 | 400 | 450 | 400 | 400 | 400 | |

TABLE 1-continued

|  | Example 1 | | | | Comparison example 1 | | | | | |
| --- | --- | --- | --- | --- | --- | --- | --- | --- | --- | --- |
|  | A1 | A2 | A3 | A4 | B1 | B2 | B3 | B4 | B5 | B6 |
| [Quartz Powder after Treatment] | | | | | | | | | | |
| Residual Carbon Concentration | 0.2 | 0.5 | 1.6 | 1.8 | — | 0.5 | 0.4 | 0.4 | 0.4 | 27.4 |
| Residual Hydroxyl group Concentration | 17 | 28 | 48 | 47 | — | 28 | 28 | 28 | 28 | 76 |
| [Quartz Crucible] | | | | | Most | | | | | |
| Bottom Part | | | | | Material | | | | | |
| Bubble content ratio before use | 0.01 | 0.03 | 0.08 | 0.09 | Quart | 0.13 | 0.17 | 0.16 | 0.31 | 0.28 |
| Bubble content ratio after use | 0.3 | 0.9 | 2.8 | 3.1 | Powder was sintered | 5.3 | 8.7 | 7.7 | 20 | 25.2 |
| Side Part | | | | | while | | | | | |
| Bubble content ratio before use | 0.03 | 0.1 | 0.21 | 0.28 | while | 0.33 | 0.5 | 0.47 | 0.4 | 0.44 |
| Bubble content ratio after use | 1.1 | 3.1 | 6.7 | 8 | Vacuum Baking | 11.6 | 24.1 | 20.9 | 28 | 40.3 |
| Rate of Single Crystalization | 80 | 78 | 78 | 72 | — | 48 | 45 | 43 | 30 | 20 |
| Evaluation | ◎ | ◎ | ○ | ○ | X | X | X | X | X | X |

(Notice) Bubble Content Ratio is the value at 0.5 mm from the inside surface.
Regarding Evaluation, ◎ is the best, ○ is better, X is bad.
Rate of Single Crystalization is the weight of single crystal or the weight of material many crystals (%).
Units of Bubble content ratio and Rate of Single Crystalization are %..
Units of Residual Carbon Concentration and Residual Hydroxyl group Concentration are ppm.

What is claimed is:

1. A crucible used for the production of single crystals, the crucible comprising a quartz glass layer forming an inside surface of the crucible, wherein the quartz glass layer is produced by a process comprising fusing a modified synthetic silica powder, wherein the modified synthetic silica powder is produced by the process comprising:
   placing in a vacuum vessel a synthetic silica powder produced by a sol-gel process from a metal alkoxide precursor, wherein the synthetic silica powder comprises gases adsorbed on the powder and has residual carbon and residual hydroxyl groups therein;
   heating the synthetic silica powder in the vacuum vessel in a range of from a degas temperature of the synthetic silica powder to a temperature below the sintering temperature of the synthetic silica powder while evacuating the vacuum vessel to a pressure of 5 Pa or less, wherein the adsorbed gases are removed from the synthetic silica powder, without sintering the synthetic silica powder, so as to reduce residual carbon in the synthetic silica powder to less than 2 ppm and residual hydroxyl groups in the synthetic silica powder to less than 50 ppm;
   introducing into the vacuum vessel an atmosphere consisting of helium after removing the adsorbed gases from the synthetic silica powder, wherein the helium is introduced into the vacuum vessel while the synthetic silica powder is still at a temperature of 700° C. or more, such that helium is fully adsorbed on the synthetic silica powder; and,
   cooling the synthetic silica powder in the atmosphere consisting of helium to a temperature of 400° C. or less to form a modified synthetic silica powder, wherein the degas temperature is 700° C. or more, and the sintering temperature is 1400° C. or more;
   wherein the quartz glass layer is transparent,
   wherein the inside surface includes a bottom part and a side wall part; the quartz glass layer has a thickness of less than 0.5 mm; and a bubble content of the quartz glass layer before use is less than 0.1 volume % at the bottom part and less than 0.3 volume % at the side wall part,
   wherein a bubble content of the quartz glass layer after use is less than 5 volume % at the bottom part and less than 10 volume % at the side wall part.

2. The crucible according to claim 1, wherein the heating temperature is in a range of from 800° C. to 1200° C.

3. The crucible according to claim 1, wherein the helium introduced into the vacuum vessel has a dew point of −50° C. or less.

4. The crucible according to claim 1, wherein the vacuum vessel is a vacuum furnace.

5. A crucible used for the production of single crystals, the crucible comprising a quartz glass layer forming an inside surface of the crucible, wherein the quartz glass layer is produced by a process comprising fusing a modified synthetic silica powder, wherein the modified synthetic silica powder is produced by the process comprising:
   providing an amorphous synthetic silica powder produced by a sol-gel process from a metal alkoxide precursor, wherein the synthetic silica powder comprises gases adsorbed on the powder and has residual carbon and residual hydroxyl groups therein;
   heating the synthetic silica powder in a vacuum furnace to a heating temperature in a range of from 700° C. to 1400° C. but less than a sintering temperature thereof;
   maintaining the synthetic silica powder in the vacuum furnace in the range of from 700° C. to 1400° C. but less than the sintering temperature, while evacuating the vacuum furnace to a pressure of 5 Pa or less, so as to reduce residual carbon in the synthetic silica powder to less than 2 ppm and residual hydroxyl groups in the synthetic silica powder to less than 50 ppm;
   introducing into the vacuum furnace helium having a dew point of −50° C. or less after reducing the residual carbon and the residual hydroxyl groups in the synthetic silica powder;
   cooling the synthetic silica powder in the helium in the vacuum furnace to 400° C. or less to form a modified synthetic silica powder; and
   bringing the modified synthetic silica powder out of the vacuum furnace into air,
   wherein the quartz glass layer is transparent,
   wherein the inside surface includes a bottom part and a side wall part; the quartz glass layer has a thickness of less than 0.5 mm; and a bubble content of the quartz glass layer before use is less than 0.1 volume % at the bottom part and less than 0.3 volume % at the side wall part,
   wherein a bubble content of the quartz glass layer after use is less than 5 volume % at the bottom part and less than 10 volume % at the side wall part.

6. The crucible according to claim 5, wherein the heating temperature is in a range of from 800° C. to 1200° C.

* * * * *